United States Patent [19]  
Hubbard

[11] Patent Number: 4,866,841  
[45] Date of Patent: Sep. 19, 1989

[54] INTEGRATED CIRCUIT CHIP CARRIER

[75] Inventor: John B. Hubbard, Watton-on-Thames, England

[73] Assignee: Advanced Semiconductor Packages Ltd., Ashford, England

[21] Appl. No.: 244,959

[22] Filed: Sep. 15, 1988

[30] Foreign Application Priority Data

Sep. 16, 1987 [GB] United Kingdom ............... 8721779

[51] Int. Cl.$^4$ .............................................. H01R 9/16
[52] U.S. Cl. ........................................ 29/845; 29/841; 174/52.2; 357/70; 357/72; 361/386; 437/215; 439/65
[58] Field of Search ................. 29/845, 840, 841, 884; 174/52.2, 68.5; 357/70, 72, 81; 361/386, 395, 396, 409, 410; 437/215; 439/65

[56] References Cited

U.S. PATENT DOCUMENTS 4,393,581 7/1983 Cherian .......................... 361/386 X
4,461,529 7/1984 McGhee ............................... 29/884
4,513,355 4/1985 Schroeder et al. .............. 439/65 X
4,618,739 10/1986 Theobald ....................... 437/215 X
4,677,526 6/1987 Muehling ........................ 357/70 X
4,823,234 4/1989 Konishi et al. .................. 29/841 X Primary Examiner—Howard N. Goldberg
Assistant Examiner—Carl J. Arles
Attorney, Agent, or Firm—Ladas & Parry

[57] ABSTRACT

An integrated circuit chip carrier with pin grid array is provided with at least two layers of plastics material on the upper of which is provided a central chip location area and a series of metallized areas provided by printed circuit board methods to a series of metallized holes disposed inwardly of the edges of the carrier, a wall of plastics material being disposed round the edges of said upper layer to form a central cavity, the lower layer of plastics material bonded to said upper layer having a series of openings for a pin grid array and an intermediate metallized printed circuit layer disposed between said upper and lower layers to provide electrical conductive paths from the metallized holes to the openings and pins extending downwardly from said lower layer with heads mounted in said openings said array of pins being capable of being across the entire under surface of the carrier. The structure provides superior arrays of pins and similar techniques for construction.

1 Claim, 2 Drawing Sheets

INTEGRATED CIRCUIT CHIP CARRIER

This invention relates to the field of integrated circuit chip carriers.

Integrated circuit chips have been packaged in various ways. Originally they were packaged in the well-known dual in-line packages in which series of extending terminals on each side of the package were slotted into a circuit board. However, these packages are unsatisfactory in that different lengths of lead were necessary depending on the length of the package and also the terminals are usually soldered which makes them difficult to replace. Chip carriers have been proposed in which ceramic or plastic bases were provided with terminal points around the periphery. Here again permanent attachment to the circuit board was usually necessary.

It would be desirable to package integrated circuit chips onto pin grid arrays. Ceramic pin grid arrays have been proposed but has not proved as flexible as desired. In the known form of chip carrier in the pin grid array system there is usually a rectangular base of ceramic material. A central area on the base is provided onto which an integrated circuit chip or die can be secured, for example, using an epoxy resin adhesive. Leads are then connected between the appropriate points on the die to various points at the periphery and therefrom to the underside of the carrier to connect to an array of pins extending downwards from the carrier. Usually such connection is by a connection through a hole in the carrier to the pin mounting point vertically beneath the entry into the upper surface of the carrier, for example, by through-hole metallisation. Thus, for example, the chip can be mounted on the die and connected to a series of metal bonding pads on the carrier base which lead in turn by preformed metallisation patterns to the points through which vertical connection is made to the pins beneath. A metal or ceramic lid can be secured over the main structure or base so as to enclose and protect the chip or die. Such an array can readily be applied to a board with the pins inserted into appropriate sockets in the board to connect at various levels in the board.

However, the use of ceramic materials for chip carriers is expensive. Additionally, the high dielectric constant of the ceramic and the poor conductivity of the metallization (compared to copper) make these packages unsuitable for high speed integrated circuits.

Therefore pin grid arrays are now being manufactured by printed circuit board (PCB) technology as an alternative to ceramic. However, a difficulty with present PCB pin grid arrays is that it has not yet been possible to have an array of pins right across the whole base of the carrier, so placing pins beneath the central area on which the chip is mounted is not possible, which consequently limits the interconnection density of these packages.

According to the present invention there is provided a pin grid array mounting for an integrated circuit chip comprising an upper sheet of plastics material on the upper surface of which there is provided a chip locating area surrounded by a series of pads and connectors each of which connect as leads to a hole extending at least partially through the structure of the carrier to the undersurface said hole being metallised to provide a connection between a pad in the upper surface and a pad in the lower surface of said upper sheet, a series of conductor tracks as an intermediate layer extending from said metallised holes to a series of pads distributed in even pattern across the whole of the area of the chip carrier including beneath the chip area, a second plastics layer adhered to the first provided with a series of openings corresponding to the pattern of the final pads in the intermediate layer and in electrical contact therewith, a series of pins extending downwardly from the lower layer and having heads disposed in said openings in the lower layer and a wall extending around the periphery of the upper layer to create a cavity in the centre of the carrier.

The invention can also be stated as relating to an integrated circuit chip carrier with pin grid array comprising an upper layer of plastics material with central chip location area, a series of metallised areas electrically connective from points disposed about the location area to a series of metallised holes disposed inwardly of the edges of the carrier, a wall of plastics material disposed round the edges of said upper layer to form a central cavity, a lower layer of plastics material bonded to said upper layer and having a series of openings for a pin grid array, an intermediate metallised layer disposed between said upper and lower layers to provide electrical conductive paths from the metallised holes to regions surrounding or above said openings, pins extending downwardly from said lower layer with heads mounted in said openings said heads being electrically connected with said electrical conductive paths, said array of pins being capable of being across the entire under surface of the carrier.

In another aspect of the invention there is provided a carrier wherein the lower layer has metallised areas on the upper and lower surfaces those on the upper surface including the electrical conductive paths.

In one embodiment the conductor tracks are formed on the upper surface of the lower layer and electrical contact is provided between the metallisation of the holes in the first or upper layer and the intermediate layer tracks or paths.

Alternatively the upper layer has metallised areas on the upper and lower surfaces to provide the metallised paths from about the chip location area to the holes and from the holes to the areas disposed about the openings.

The openings in the lower layer can be metallised which metallisation conects with the tracks in the intermediate layer.

The same manufacturing principles can be used to add further signal, power and ground planes within the carrier. The use of buried plated through holes enable additional interconnections to be made. Wire bonding planes at stepped levels may be incorporated to interconnect the layers.

The plastics material can be one of a number of plastics materials but preferably is the type of plastics material used in a printed circuit board manufacture, for example, a glass reinforced epoxy resin. The holes extending through the upper layer can extend completely through to the lower layer but the holes or openings in which the pins are mounted will only extend to the upper surface of the lower layer.

The invention will now be illustrated with reference to the accompanying drawings in which.

Figure 1:
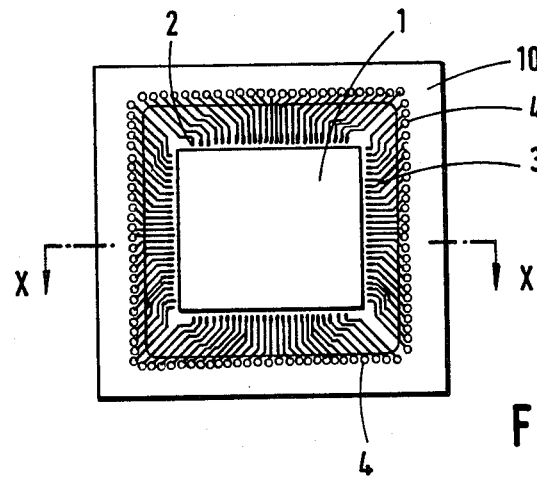
FIG. 1 is a plan view of the upper surface of the first layer of the carrier.
Figure 5:
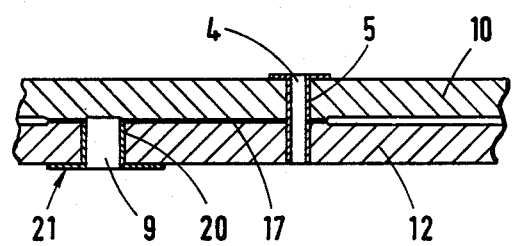
FIG. 5 is the detailed cross-section of the two principal layers of the carrier.
Figure 7:
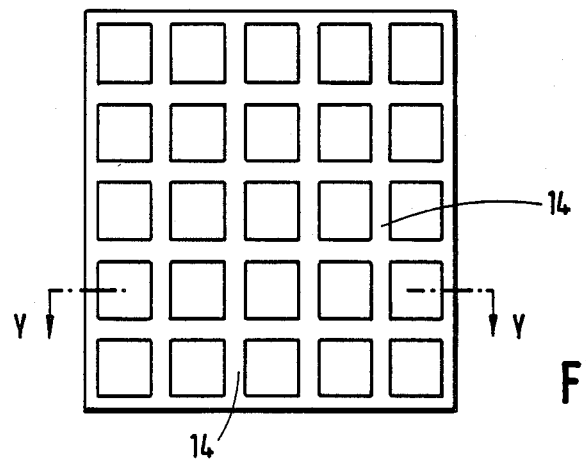
FIG. 7 is a plan view of the grid arrangement of side walls.
Figure 8:
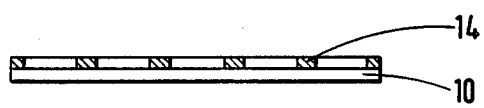
FIG. 8 is a cross-section along the line Y—Y of FIG. 6.

Each individual carrier will have an upper layer 10, an intermediate layer 11 and a lower layer 12. On layer 10 is a chip pad 1 surrounded by a series of pads 2 with metal surface connections tracks or paths 3 formed to a series of points in zones at which points are formed metallised holes 4 the upper entrances to which are shown in FIG. 1 and shown in cross-section in FIG. 5. Each of those holes is formed with plated-through metallisation 5 to connect the connection 3 (which can end in a pad at the point in the zone) to a pad 6 in the intermediate layer 11. From each of fthese pads there extends a metal connector 7 inwardly or outwardly of the line of holes to a further pad 8.

Figure 2:
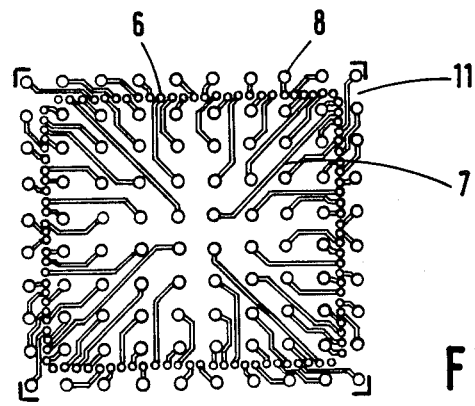
FIG. 2 is the pattern of the intermediate layer.
Figure 3:
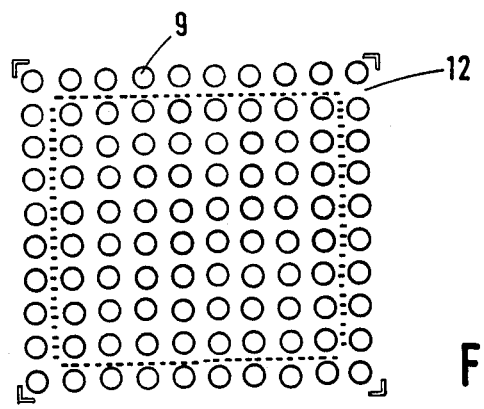
FIG. 3 is the pattern of holes in the lower layer.
Figure 4:
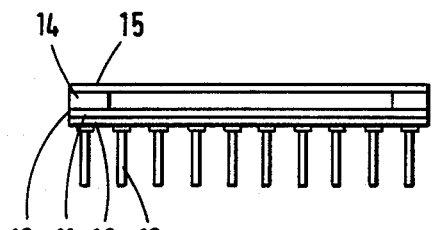
FIG. 4 is a cross-section through a pin array along line X—X of FIG. 1.
Figure 6:
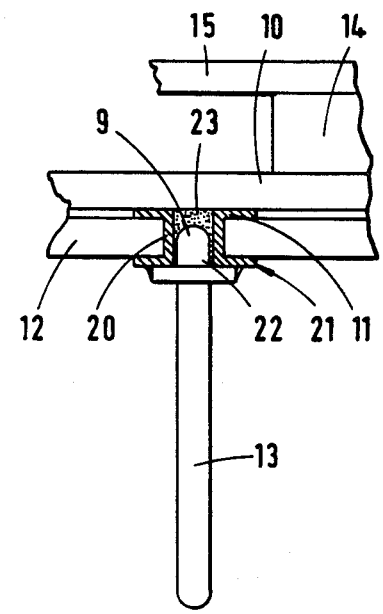
FIG. 6 is a detailed cross-section of the pin-head structure.

The lower layer 12 consists of a pattern of openings 9 each of these openings has a plated-through metallisation 20 to provide a metallic contact around the periphery of the opening and connect pad 8 on the intermediate layer with a lower pad 21. In each opening 9 there is mounted head 22 of a pin 13 contact being provided between the head of the pin and the metallisation 20 in the opening 9. The top of the pin may rest against the pad 8 in the upper layer. In the completed pin array the upper surface is surrounded by a wall 14 on which may be placed a lid 15. Preferably the chip carriers are formed in series by initially forming by conventional printed circuit techniques the metallisation pattern of FIGS. 1 and 2 using as the upper layer a plastics material with copper on the upper side and as the lower a layer with copper on both sides. Pads, connectors and plated through metallisation are all formed by conventional techniques used in printed circuit board manufacture preferably from copper plating with gold or nickel-gold alloy. Alternatively the pattern of the intermediate layer 11 can be formed on the lower surface of the upper layer 10 by using a double sided copper printed circuit board material. The holes at 4 can be drilled after the upper and lower layers are bonded together so then as to provide metallisation at least through the upper layer from pad at area 4 to lower pad 8. As shown in FIG. 6 the head 22 of the pin 13 extends into the opening 9.

The openings in layer 12 can be metallised after or preferably before bonding of the layers together. Extension of the holes 4 through the entire array eases metallisation because of the narrow diameter of the holes 4. The diameter of the larger holes 9 provided for the pin heads allows easier access for metallisation. It will be noted that the holes 4 are inwards of the outer limits of the pin array locations and the connections 7 extend outwardly and inwardly from the initial holes 4 so permitting a complete range of pins across the entire undersurface of the carrier.

After assembly of the initial two layers a third matrix grid 14 preferably formed of the same material as the other two layers is bonded to the upper surface the arms of the grid extending along the peripheries of the proposed chip carriers covering the holes 4. At this stage one has then an array of pin grid assemblies. Pins can be loaded into the pin holders having for example, holes on an 2.5 millimeter (0.1 inch) array grid and the heads 9 of the pins can be fused into position using standard solder reflow methods to form solderbond 23. The pins can be mounted into the openings 9 by solder paste applied to the pads 8 by conventional techniques silk screening methods. Alternatively the pins can be added to the assembly after separation of the individual pin grid assemblies as hereinafter described.

The assembly of a series of pin grid arrays is cut into individually arrays thus separating to form the individual chip carriers using a diamond saw along the centre lines of the arms 14. Individual integrated circuit chips can be mounted in a cavity or depression formed by the arms 14 of the grid before or after formation of the individual arrays. The cavity can be filled with a layer of coating material made of a plastics material which serves to enclose and protect the chip. Thereafter a cover sheet 15 preferably formed of the same material as the base 10 may be secured over the walls 14 to form a protective cover known as a lid for each of the chip carriers. Aternatively a further layer of coating material could be applied instead of the lid said coating material being the same or different from the basic coating material to provide additional protection for the chip. The resulting assembly can then be mounted into a printed circuit board by insertion of the pins of the assembly into respective holes on the circuit board.

It can be seen that the chip carrier can be made of conventional printed circuit board material and a whole series of arrays can be formed simultaneously. The co-ordination of the different layers and interconnection of the different pads is much more simple than handling individual arrays since there is use of the sheet up to the point at which the individual chip carriers are separated. A sheet with a series of arrays is much easier to handle than individual chip carriers and can readily be processed by automatic assembly apparatus including the drilling of the various holes, assembly of the pins and assembly, if desired, of the individual integrated circuit chips into the individual arrays. Preferably manufacture of the different layers by conventional glass-/epoxy printed circuit board material and printing techniques allows well tried and tested techniques to be used and greatly reduces the cost of the final item. The individual chips mounted in the central chip pads can be connected to the pads 2 for the surrounding connectors by conventional techniques such as wire bonding, the chips or dies being bonded to the base by means of an epoxy adhesive compatible with the material of the base. The number and disposition of the pads and underlying pin arrays can be determined in ådvance so as to correspond to the desired pin array for the corresponding circuit board.

I claim:

1. A method of forming a pin grid integrated chip carrier comprising from two layers of plastics material the upper with a central chip mounting area and the lower with pins disposed in the desired array comprising:

(a) forming an upper sheet by printed circuit techniques comprising a series of carrier arrays each consisting of a central chip mounting area and metallized paths from adjacent to said area to points in zones disposed around each proposed carrier array and inwardly of the proposed edges thereof, (b) forming a second layer of plastics material with a series of arrays of openings each array corresponding to a desired array of pins, (c) the upper surface of the second sheet or the lower surface of the first sheet having second metallized paths formed by printed circuit techniques from points in the zones to locations corresponding to the openings.

(d) binding together the two layers, (e) either before or after assembly
　(i) forming holes in at least the upper layer in the points
in the zones.
　(ii) metallizing the holes to provide connections between the metallized paths on the upper surface of the upper layer and the second metallized paths,
　(iii) optionally metallizing the openings, (f) applying to the upper layer a grid of plastics material each arm of the grid lying above and on both sides of a proposed edge between two adjacent carriers, (g) separating the carrier by cutting along the edge lines, (h) either before or after separating insert heads of pins into the openings with means for retaining said heads and providing electrical connectors to the metallized paths between the layer of plastic materials.

(i) optionally inserting the chip and providing a coating on the chip in the cavity resulting from the grid arms and, if desired applying a cover over the cavity.

* * * * *